(12) United States Patent
Hopper et al.

(10) Patent No.: US 6,660,537 B1
(45) Date of Patent: Dec. 9, 2003

(54) METHOD OF INDUCING MOVEMENT OF CHARGE CARRIERS THROUGH A SEMICONDUCTOR MATERIAL

(75) Inventors: Peter J. Hopper, San Jose, CA (US); Philipp Lindorfer, San Jose, CA (US); Kyuwoon Hwang, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/219,211

(22) Filed: Aug. 15, 2002

(51) Int. Cl.[7] .................................................. H01L 21/00
(52) U.S. Cl. .................. 438/3; 438/78; 438/88
(58) Field of Search .................. 438/3, 78, 88; 257/E43.002, E43.003

(56) References Cited

U.S. PATENT DOCUMENTS 6,208,497 B1 * 3/2001 Seale et al. .................. 361/160
6,297,155 B1 * 10/2001 Simpson et al. ............ 438/687
6,355,971 B2 * 3/2002 Schligtenhorst et al. .... 257/566

* cited by examiner

Primary Examiner—John F. Niebling
Assistant Examiner—Viktor Simkovic
(74) Attorney, Agent, or Firm—Mark C. Pickering

(57) ABSTRACT

A conductive trace is formed over and insulated from a region of semiconductor material, such as a region adjacent to the n+ region of an n+/p− photodiode, and a sawtooth current is made to flow through the conductive trace. The sawtooth current induces charge carriers to move through the semiconductor material to a collection region in the semiconductor material.

11 Claims, 6 Drawing Sheets

METHOD OF INDUCING MOVEMENT OF CHARGE CARRIERS THROUGH A SEMICONDUCTOR MATERIAL

BACKGROUND OF THE INVENTION

1. Field of the Invention

The present invention relates to charge carriers in a semiconductor material and, more particularly, to a method of inducing charge carriers to move through the semiconductor material.

2. Description of the Related Art

Semiconductor devices often utilize an electric field to induce the movement of charge carriers through a semiconductor material from one location to another location. For example, an n+/p− photodiode is a semiconductor device that utilizes an electric field to collect photo-generated electrons.

FIG. 1 shows a cross-sectional diagram that illustrates a prior art n+/p− photodiode 100. As shown in FIG. 1, photodiode 100 includes a p− substrate 110 and an n+ region 112 that is formed in substrate 110. When n+ region 112 is formed in substrate 110, a depletion region 114 is formed that separates substrate 110 from n+ region 112.

In operation, photodiode 100 is first reset by placing a positive potential on n+ region 112 with respect to p− substrate 110. The potential difference across the n+/p− junction reverse biases the junction, increasing the size of depletion region 114 and the magnitude of the electric field across the junction.

Once reset, light energy, in the form of photons, is collected by photodiode 100 which forms a number of electron-hole pairs. The electrons from the electron-hole pairs that are formed in depletion region 114 move under the influence of the electric field towards n+ region 112, where each additional electron collected by n+ region 112 reduces the positive potential that was placed on n+ region 112 during reset. On the other hand, the holes formed in depletion region 114 move under the influence of the electric field towards p− substrate 110.

In addition, the electrons, which are from the electron-hole pairs that are formed in p− substrate 110 within a diffusion length of depletion region 114, diffuse to depletion region 114 and are swept to n+ region 112 under the influence of the electric field. Further, the electrons that are formed in n+ region 112 remain in n+ region 112.

After photodiode 100 has collected light energy for a period of time, known as the integration period, sense circuitry associated with the photodiode detects the change in potential on n+ region 112. As noted above, the electrons collected by n+ region 112 reduce the magnitude of the positive potential that was originally placed on n+ region 112. Once the change in positive potential has been sensed, photodiode 100 is reset and the process is repeated.

One measure of photodiode 100 is the efficiency with which photodiode 100 can collect the photo-generated electrons. Not all of the electrons from the electron-hole pairs are collected by n+ region 112. Instead, a number of electrons recombine with holes. When an electron recombines with a hole, the photo information associated with the electron is lost.

One limitation of photodiode 100 is that when photodiode 100 is reset, the space charge distribution is unequal. FIG. 2 shows a perspective view that illustrates the n+ region 200 of a prior art n+/p− photodiode following reset. As shown in FIG. 2, n+ region 200 is a square-shaped area that has a contact region 210.

During reset, a positive voltage is applied to contact region 210 for a predetermined period of time. When the positive voltage is removed, a number of zones of decreasing positive charge, such as zones Z1–Z5, result. When the electrons are then collected during the integration period, an unequal space charge distribution results.

The change in potential that occurs during the integration period can be detected by electrically connecting the potential on n+ region 112 to the gate of a source-follower transistor. An electrical connection to n+ region 112 is typically made by forming a contact on the surface of n+ region 112. However, as shown in FIG. 2, the potential sensed by the contact depends on the zone Z1–Z5 the contact is located in.

SUMMARY OF THE INVENTION

The present invention provides a method of inducing charge carriers to move through a semiconductor material to a collection region in the semiconductor material. The method utilizes a conductive trace that is formed over and insulated from the semiconductor material.

In accordance with the present invention, the method includes the step of making a sawtooth current flow through the conductive trace. The sawtooth current induces charge carriers to move through the semiconductor material to the collection region. The sawtooth current has a plurality of periods.

Each sawtooth period has a first edge and a second edge. The second edge has a steeper slope than the first edge, and induces charge carriers to move through the semiconductor material. The first edge, on the other hand, causes substantially no charge carriers to move through the semiconductor material.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 3A is a plan view of structure 300, FIG. 3B is a cross-sectional view taken along lines 3B—3B of FIG. 3A, and FIG. 3C is a cross-sectional view taken along lines 3C—3C of FIG. 3A.

FIG. 4A is a plan view of photodiode 400, FIG. 4B is a cross-sectional view taken along lines 4B—4B of FIG. 4A, and FIG. 4C is a cross-sectional view taken along lines 4C—4C of FIG. 4A.

FIG. 5A is a schematic diagram of cell 500. FIG. 5B is a layout plan view of cell 500. FIG. 5C is a cross-sectional view taken along line 5C—5C of FIG. 5B. FIG. 5D is a cross-sectional view taken along line 5D—5D of FIG. 5B.

DETAILED DESCRIPTION

Figure 1:
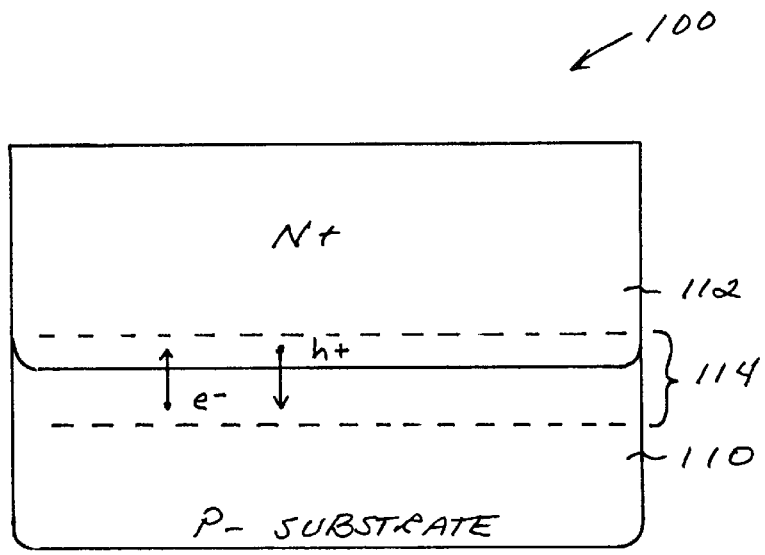
FIG. 1 is a cross-sectional diagram illustrating a prior art n+/p− photodiode 100.
Figure 2:
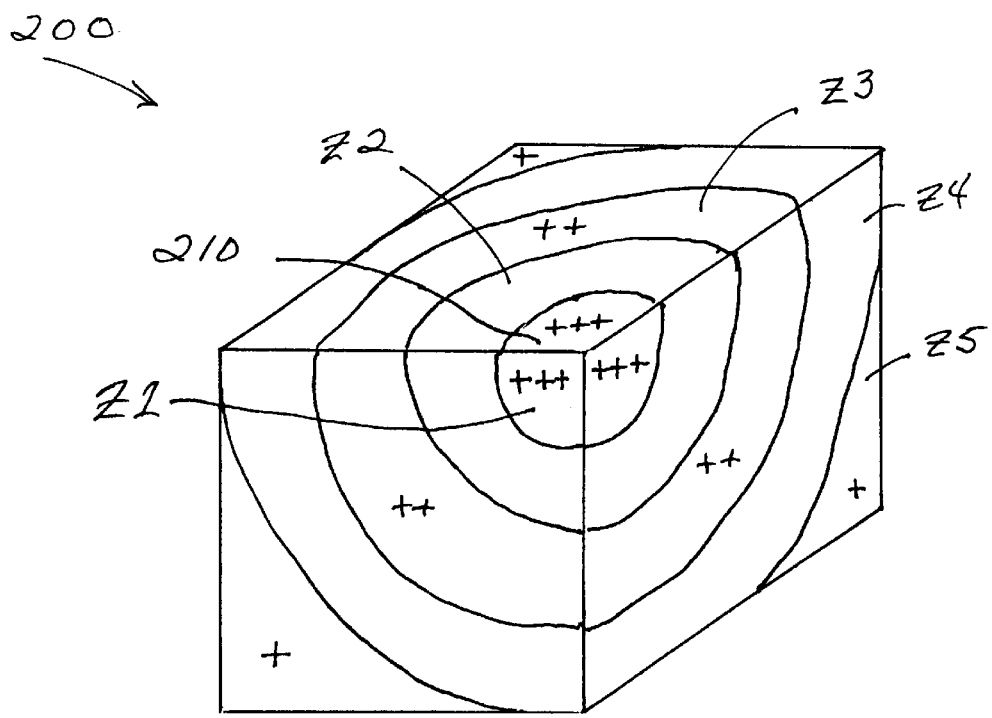
FIG. 2 is a perspective view illustrating the n+ region 200 of a prior art n+/p− photodiode following reset.
Figure 3A:
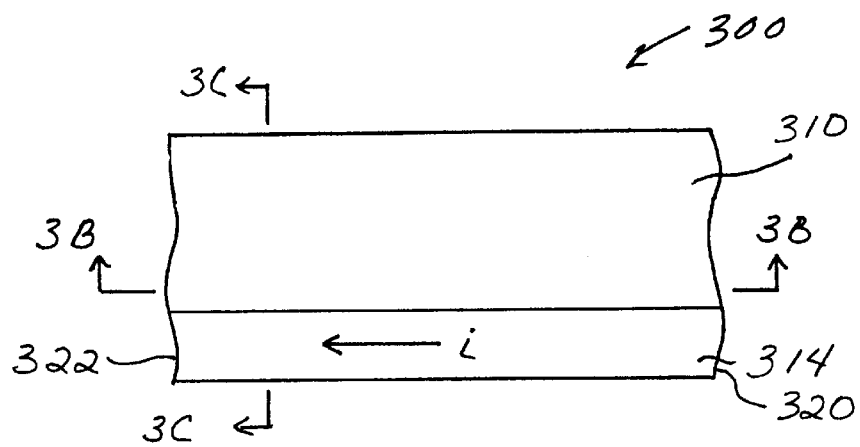
FIGS. 3A–3C are a series of views illustrating an example of a semiconductor structure 300 in accordance with the present invention.
Figure 3B:
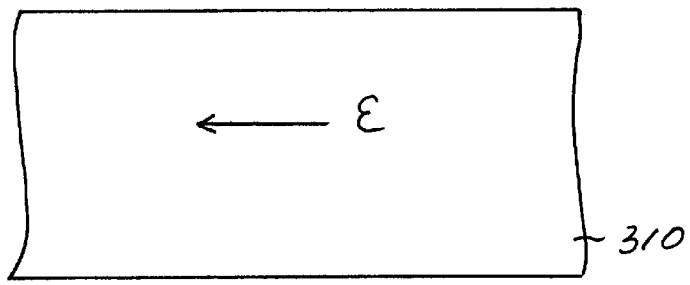
Figure 3C:
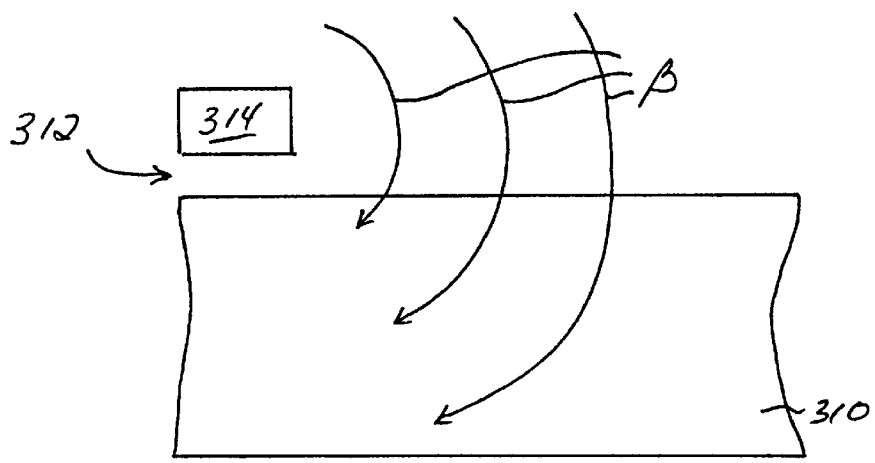

FIGS. 3A–3C show a series of views that illustrate an example of a semiconductor structure 300 in accordance with the present invention. FIG. 3A shows a plan view of structure 300, FIG. 3B shows a cross-sectional view taken along lines 3B—3B of FIG. 3A, and FIG. 3C shows a cross-sectional view taken along lines 3C—3C of FIG. 3A. As described in greater detail below, structure 300 induces the movement of charge carriers through a semiconductor material.

As shown in FIGS. 3A–3C, structure 300 includes a semiconductor material 310, such as a substrate or well, a layer of isolation material 312 that is formed over semiconductor material 310, and a conductor 314 that is formed on isolation layer 312. Conductor 314, which can be implemented with a metal trace or a polysilicon interconnect, has a first end 320 and a second end 322.

In operation, in accordance with the present invention, a current i with a sawtooth waveform is made to flow through conductor 314 from first end 320 to second end 322. The sawtooth waveform has a series of periods where each period has a relatively slow rise time, such as the rise time of a 300 Hz signal, and a relatively fast fall time, such as the fall time of a 10 GHz signal.

The relatively fast fall time of the current i produces a magnetic field β that extends into semiconductor material 310. The magnetic field β, in turn, produces an electric field ε around conductor 314 that extends into material 310 along the length of conductor 314. The electric field ε, in turn, induces positive charge carriers (holes) in semiconductor material 310 to move through material 310 in the direction of the current i. (Negative charge carriers (electrons) in semiconductor material 310 are induced to move through material 310 in the direction opposite to the flow of current i.)

On the other hand, the relatively slow rise time of current i produces a very weak magnetic field β that effectively does not extend into semiconductor material 310. As a result, when current i is placed on conductor 314, current i produces a pulsating magnetic field β which, in turn, produces a pulsating electric field in semiconductor material 310 that induces holes and electrons to move through material 310. (Alternately, the same pulsating electric field can be formed with a sawtooth waveform that has a relatively fast rise time and a relatively slow fall time.)

When conductor 314 is located approximately 2–3 microns above the surface of semiconductor material 310, the slow rise or fall time of current i requires a rise or fall time of about the rise and fall time of a 900 MHz or less signal to induce substantially no electric field in semiconductor material 310.

Similarly, the fast rise or fall time of current i requires a rise or fall time of about the rise and fall time of a signal that is greater than 900 MHz to induce an electric field that produces a net movement of charge carriers in semiconductor material 310. (Net movement meaning that at the end of one period, a charge carrier has moved a distance away from where the charge carrier was located at the beginning of the period.)

Figure 4A:
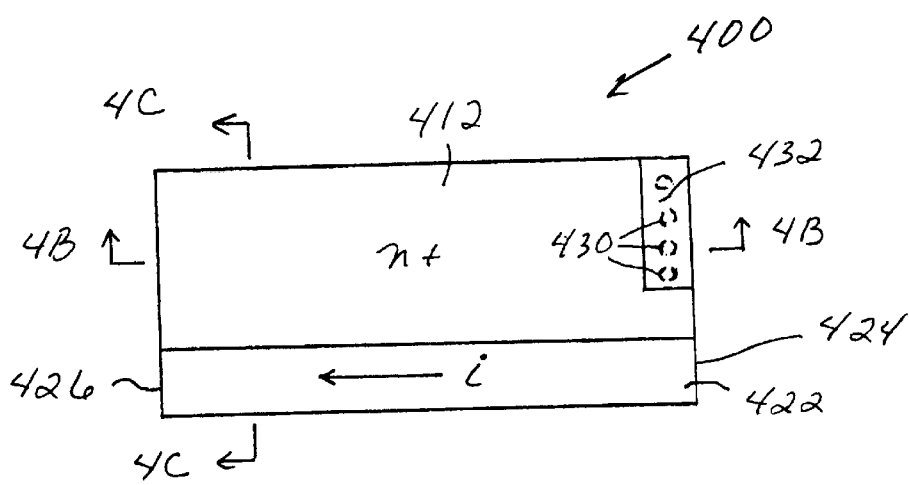
FIGS. 4A–4C are a series of views that illustrate an example of a photodiode 400 in accordance with the present invention.
Figure 4B:
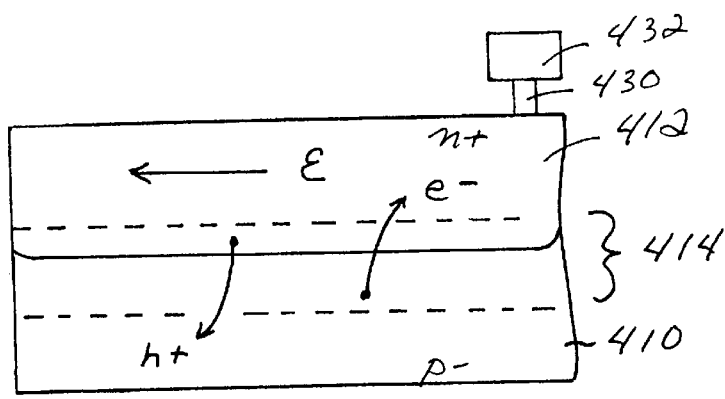
Figure 4C:
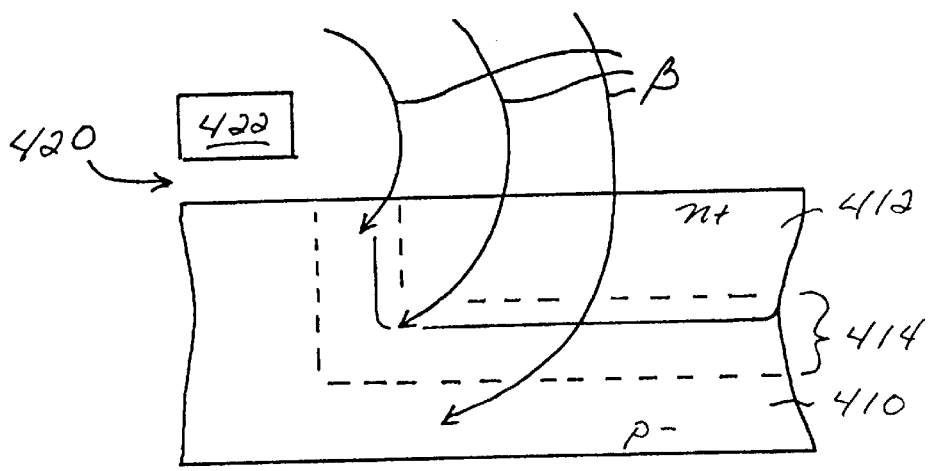

One application of the present invention is with photodiodes. FIGS. 4A–4C show a series of views that illustrate an example of a photodiode 400 in accordance with the present invention. FIG. 4A shows a plan view of photodiode 400, FIG. 4B shows a cross-sectional view taken along lines 4B—4B of FIG. 4A, and FIG. 4C shows a cross-sectional view taken along lines 4C—4C of FIG. 4A.

As shown in FIG. 4, photodiode 400 includes a p– semiconductor material 410, such as a substrate or well, and an n+ region 412 that is formed in substrate 410. When n+ region 412 is formed in material 410, a depletion region 414 is formed that separates material 410 from n+ region 412.

In addition, photodiode 400 also includes a layer of isolation material 420 that is formed over semiconductor material 410, and a conductor 422 that is formed on isolation layer 420. Conductor 422, which can be implemented with a metal trace (from any metal layer) or a polysilicon interconnect, has a first end 424 and a second end 426.

Photodiode 400 also includes a number of contacts 430 that are formed through a layer of insulation material on n+ region 412 along an edge of n+ region 412, and a conductive trace 432 that is connected to contacts 430. Contacts 430 and trace 432 are formed to be substantially perpendicular to conductor 424. Conductive trace 432 can be implemented with metal or polysilicon.

In operation, a current i with a sawtooth waveform is made to flow through conductor 422 from first end 424 to second end 426. As above, the sawtooth waveform has a relatively slow rise time, such as the rise time of a 300 Hz signal, and a relatively fast fall time, such as the fall time of a 10 GHz signal.

In the same manner as just described, the relatively fast fall time of the current i produces a pulsating magnetic field β that extends into semiconductor material 410. The magnetic field β, in turn, produces a pulsating electric field ε around conductor 422 that extends into material 410 along the length of conductor 422.

At the same time, photodiode 400 is reset by placing a positive potential on n+ region 412 with respect to p– material 410. The potential difference across the n+/p– junction reverse biases the junction, increasing the size of depletion region 414 and the magnitude of the electric field across the junction.

Once reset, light energy, in the form of photons, is collected by photodiode 400, which forms a number of electron-hole pairs. The electrons from the electron-hole pairs that are formed in depletion region 414 move under the influence of the electric field towards n+ region 412, where each additional electron collected by n+ region 412 reduces the positive potential that was placed on n+ region 412 during reset. On the other hand, the holes formed in depletion region 414 move under the influence of the electric field towards p– substrate 410.

In accordance with the present invention, as shown in FIG. 4B, the pulsating electric field ε produced by current i laterally deflects the photo-generated electrons moving up towards n+ region 412 through depletion region 414. The electrons moving through depletion region 414 can be photo-generated in depletion region 414, or material 410 within a diffusion length of depletion region 414. (Electrons can also be formed in n+ region 412, although these electrons typically don't pass through depletion region 414.)

After photodiode 400 has collected light energy for a period of time, sense circuitry associated with photodiode 400 detects the change in potential on contact 430 and conductive trace 432. As noted above, the electrons collected by n+ region 412 reduce the magnitude of the positive potential that was originally placed on n+ region 412. Once the change in positive potential has been sensed, photodiode 400 is reset and the process is repeated.

One of the advantages of the present invention is that the lateral deflection of the electrons moving towards n+ region 412 through depletion region 414 that results from the pulsating electric field ε reduces the likelihood that the photo-generated electrons will recombine with holes, thereby increasing the efficiency of the photodiode. (The holes moving towards p− material 410 are also laterally deflected in an opposite direction in the direction of the pulsating electric field ε.)

Another advantage of the present invention is that the pulsating electric field ε also induces electrons in n+ region 412 to move through n+ region 412 towards contacts 430, reducing the likelihood that electrons will become caught in surface traps. In addition, the present invention redistributes the charge carriers within n+ region 412, thereby reducing the effect of the unequal space charge distribution that results after reset.

Figure 5A:
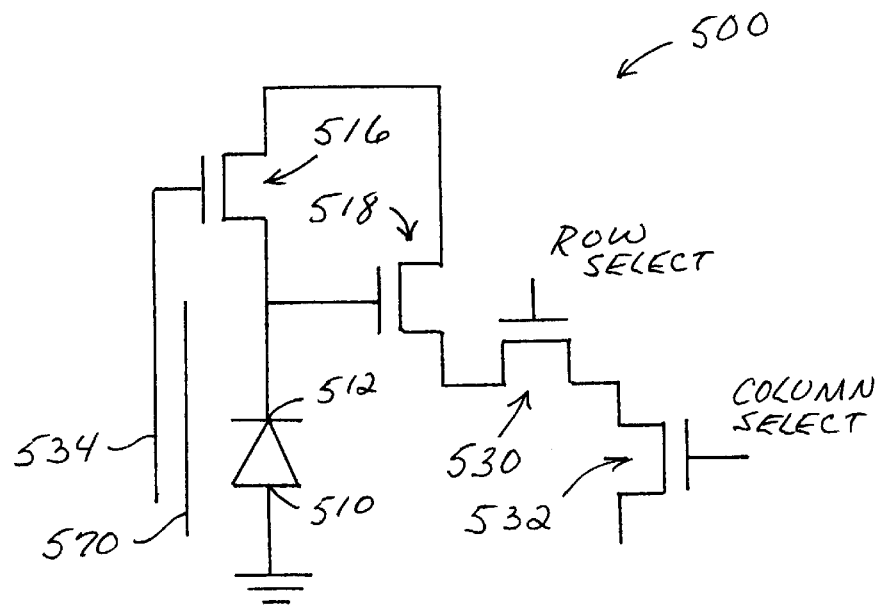
FIGS. 5A–5D are views illustrating an active pixel sensor cell 500 in accordance with the present invention.
Figure 5C:
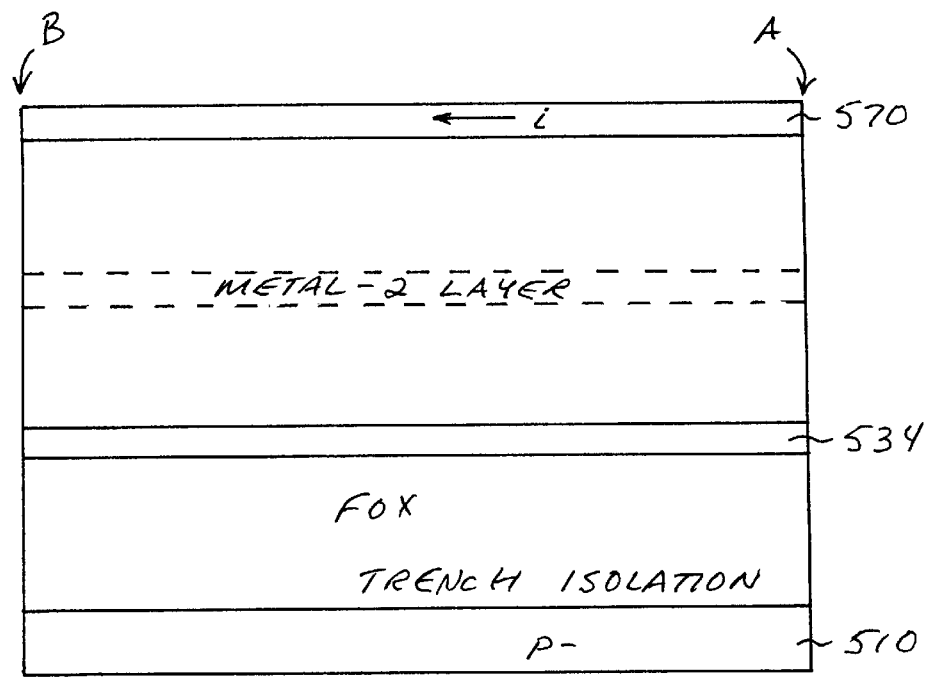
Figure 5B:
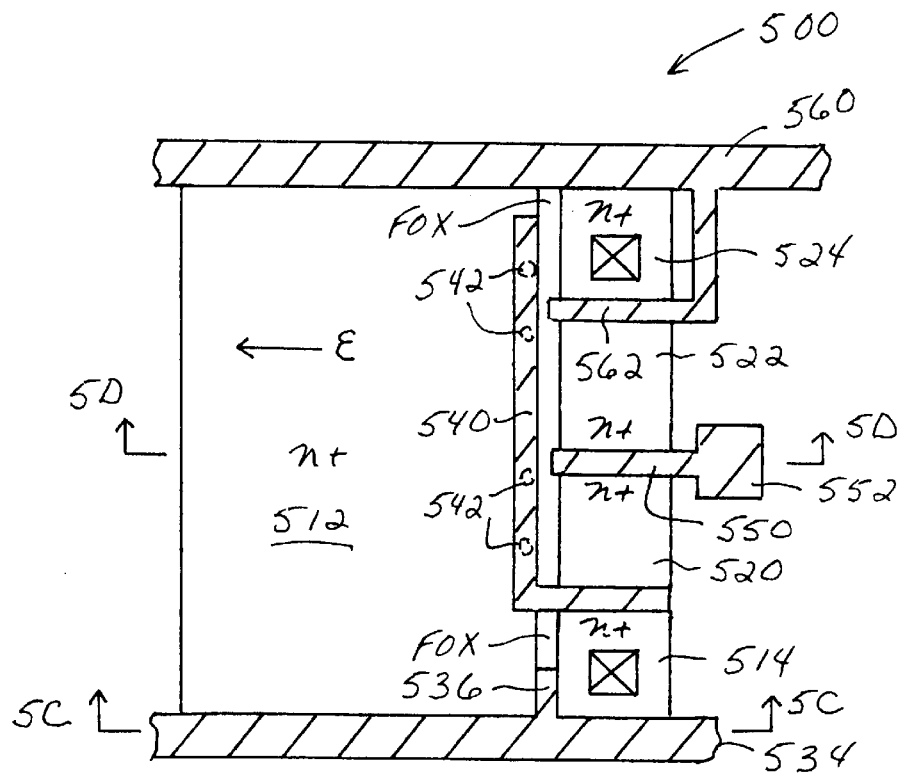
Figure 5D:
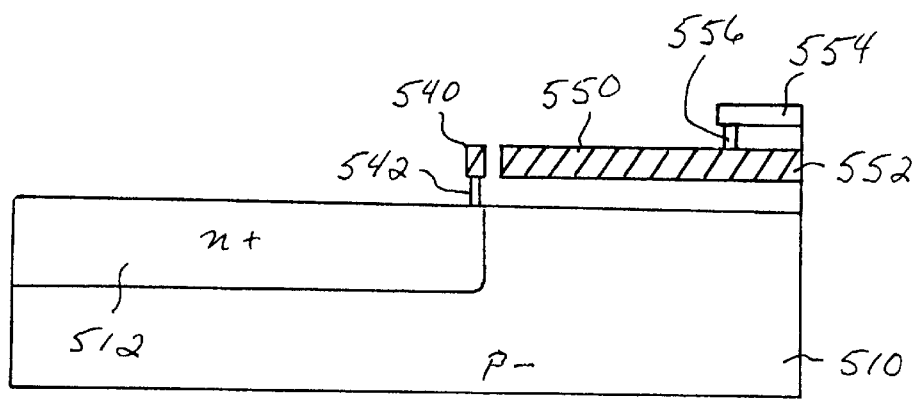

FIGS. 5A–5D show views that illustrate an active pixel sensor cell 500 in accordance with the present invention. FIG. 5A shows a schematic diagram of cell 500. FIG. 5B shows a layout plan view of cell 500. FIG. 5C shows a cross-sectional view taken along line 5C—5C of FIG. 5B. FIG. 5D shows a cross-sectional view taken along line 5D—5D of FIG. 5B.

As shown in FIGS. 5A–5D, active pixel sensor cell 500, which is formed in a p− type semiconductor material 510, such as a substrate or a well, includes an n+ photodiode region 512 that is formed in p− material 510. In addition, material 510 includes an n+ drain region 514 that is formed in material 510. Drain region 514 forms the drain for both a reset transistor 516 and a source-follower transistor 518.

Further, cell 500 includes an n+ source/drain region 520 that is formed in material 510, a source/drain region 522 that is formed in material 510, and a source region 524 that is formed in material 510. Source/drain region 520 forms the source of source-follower transistor 518 and the drain of a row select transistor 530.

In addition, source/drain region 522 forms the source of row select transistor 530 and the drain of a column select transistor 532, while source region 524 forms the source of column select transistor 532. Photodiode region 512 is isolation from adjacent devices and from drain region 514, source/drain region 520, source/drain region 522, and source 524 by a field isolation region FOX, such as trench isolation.

Cell 500 also includes a first metal layer that has been etched to form a reset line 534 that has a reset gate 536. Reset gate 536 is formed over a layer of gate oxide (not shown) which, in turn, is formed over a channel region that separates n+ photodiode region 512 from n+ drain region 514.

The first metal layer is also etched to form a sense trace 540 that is formed on a layer of isolation material (not shown) over n+ photodiode region 512. Sense trace 540 makes an electrical connection with n+ photodiode region 512 via a number of contacts 542 that are formed through the layer of isolation material. Trace 540 is also formed over a layer of gate oxide (not shown) which, in turn, is formed over a channel region that separates n+ drain region 514 from n+ source/drain region 520.

The first metal layer is further etched to form a row select gate 550 and a via contact pad 552. Row select gate 550 is formed over a layer of gate oxide (not shown) which, in turn, is formed over a channel region that separates n+ source/drain region 520 from n+ source/drain region 522. A metal-2 trace 554 formed from a second layer of metal and a via 556 are used to make an electrical connection with gate 550.

In addition, the first metal layer is etched to form a column select line 560 that has a column select gate 562. Column select gate 562 is formed over a layer of gate oxide (not shown) which, in turn, is formed over a channel region that separates n+ source/drain region 522 from n+ source region 524. Further, separate metal-2 traces, vias, and contacts (not shown) are used to make an electrical connection with n+ drain region 514 and n+ source region 524.

In accordance with the present invention, a conductive trace 570 can be formed from a third layer of metal over, for example, reset line 534. Conductive trace 570 is isolated from reset line 534 by a first layer of insulation material that is formed over reset line 534, and a second layer of insulation material that is formed over the first layer of insulation material and metal-2 traces from the second layer of metal.

In operation, a sawtooth current as described above is made to flow from point A to point B through conductive trace 570. The sawtooth current sets up a pulsating electric field ε which, in turn, induces electrons collected by n+ photodiode region 512 to accumulate in the region below sense trace 540. The electrons that accumulate beneath sense trace 540 increase the dynamic range of cell 500.

Figure 6:
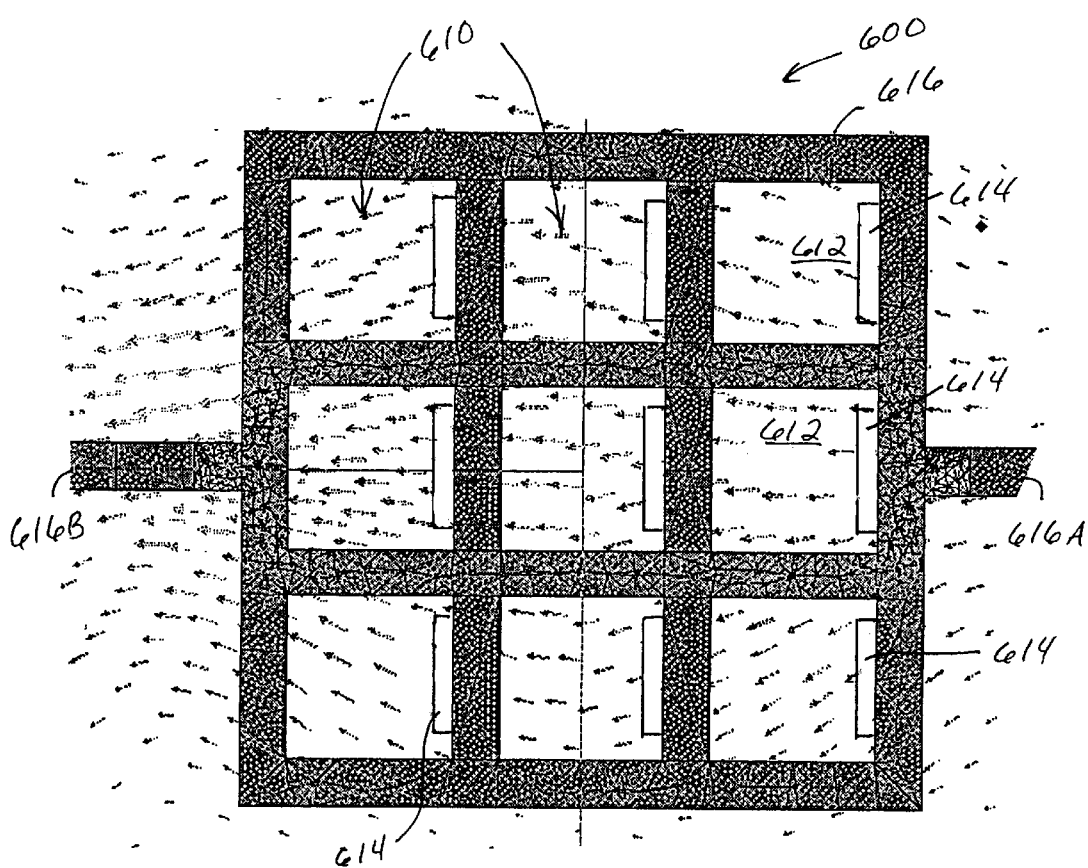
FIG. 6 is a plan view illustrating an image array 600 in accordance with the present invention.
Figure 1:
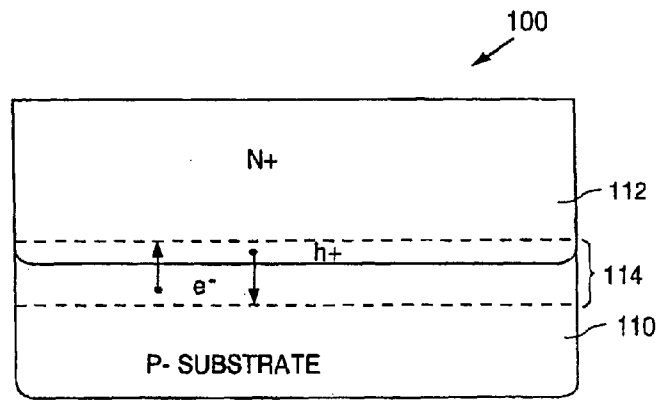
Figure 2:
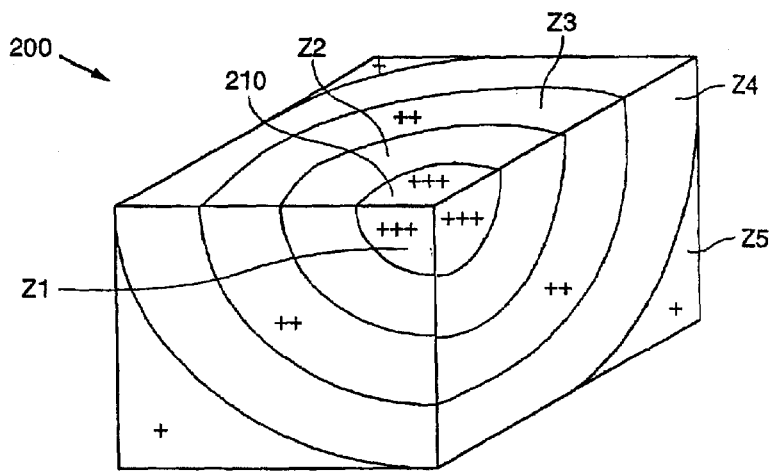
Figure 3A:
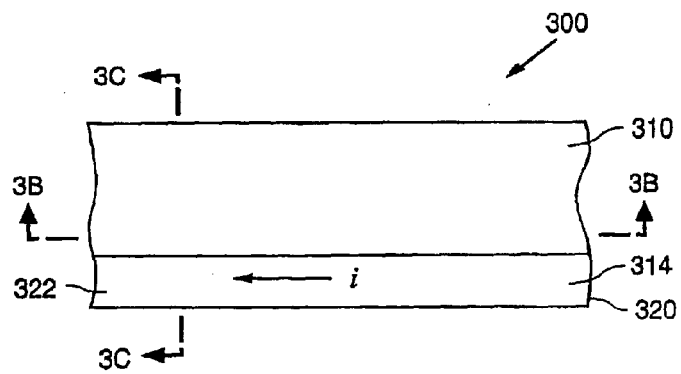
Figure 3B:
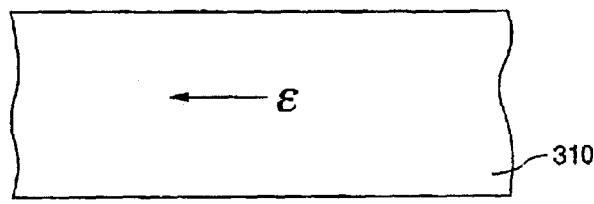
Figure 3C:
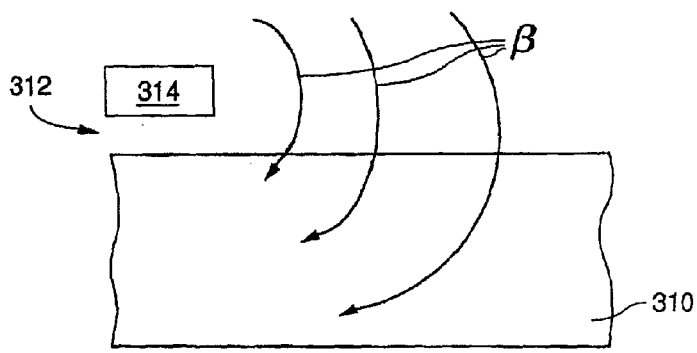
Figure 4A:
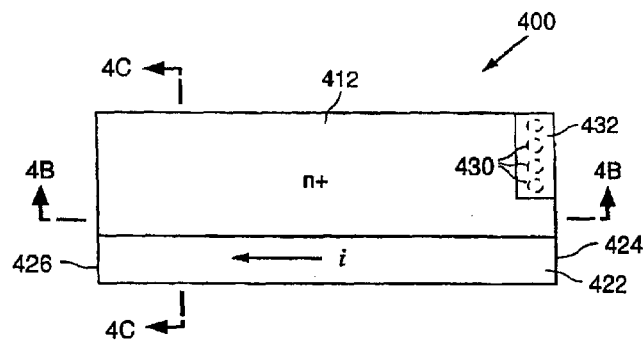
Figure 4B:
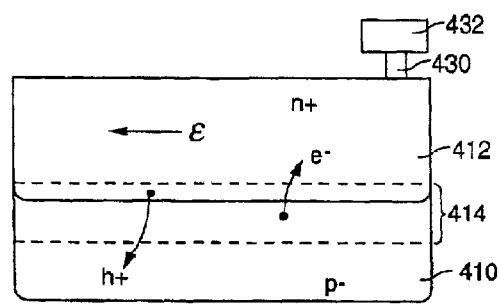
Figure 4C:
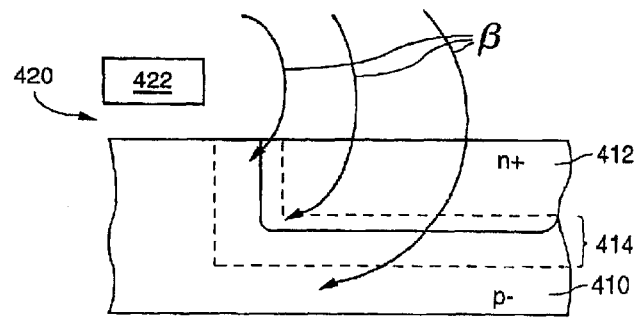
Figure 5A:
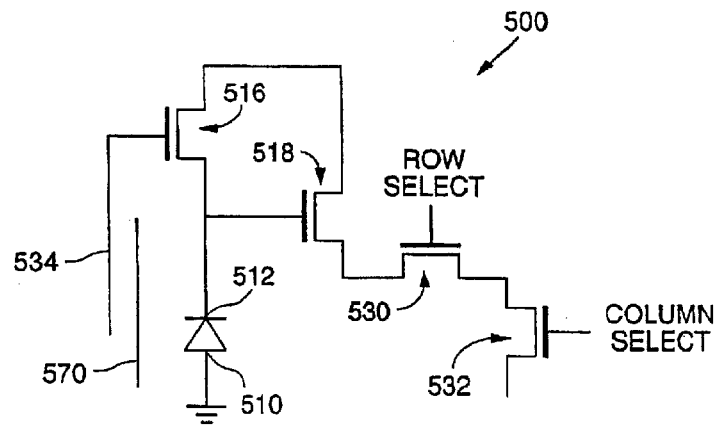
Figure 5C:
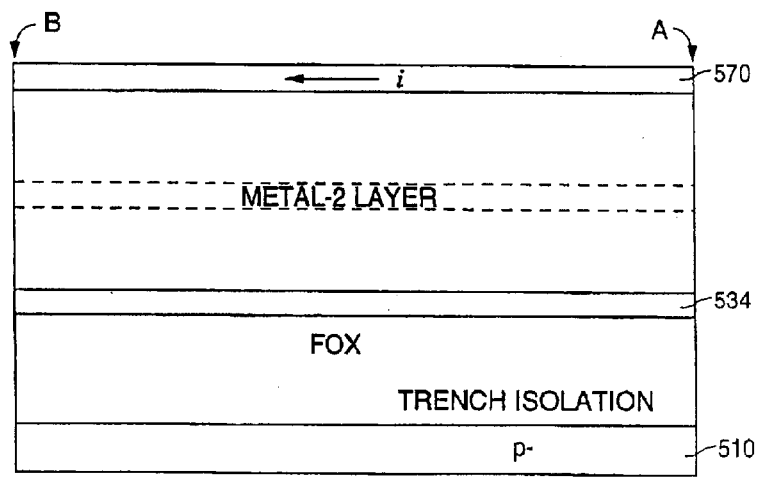
Figure 5B:
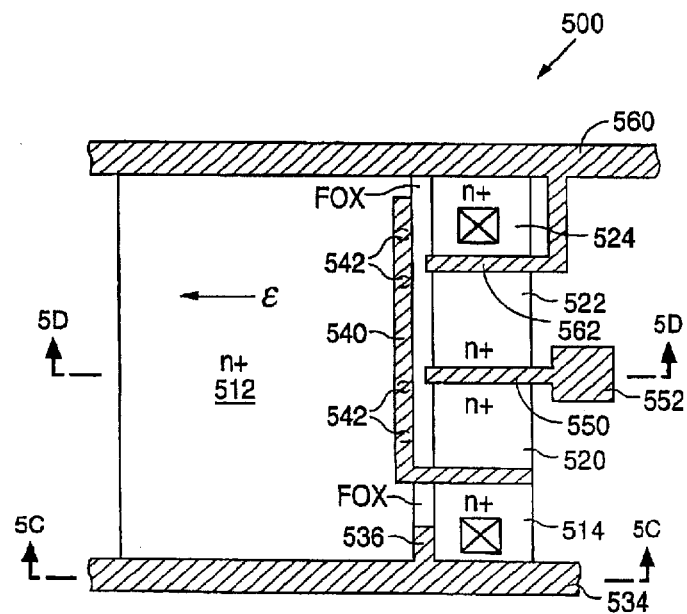
Figure 5D:
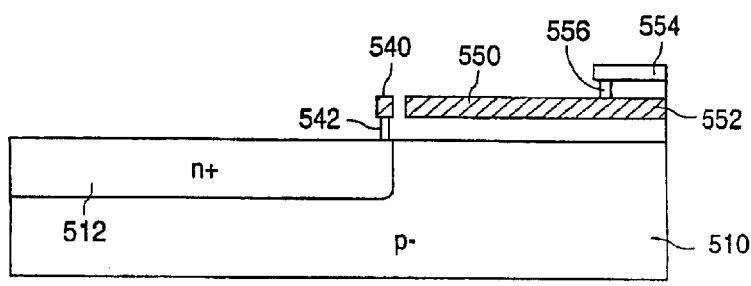
Figure 6:
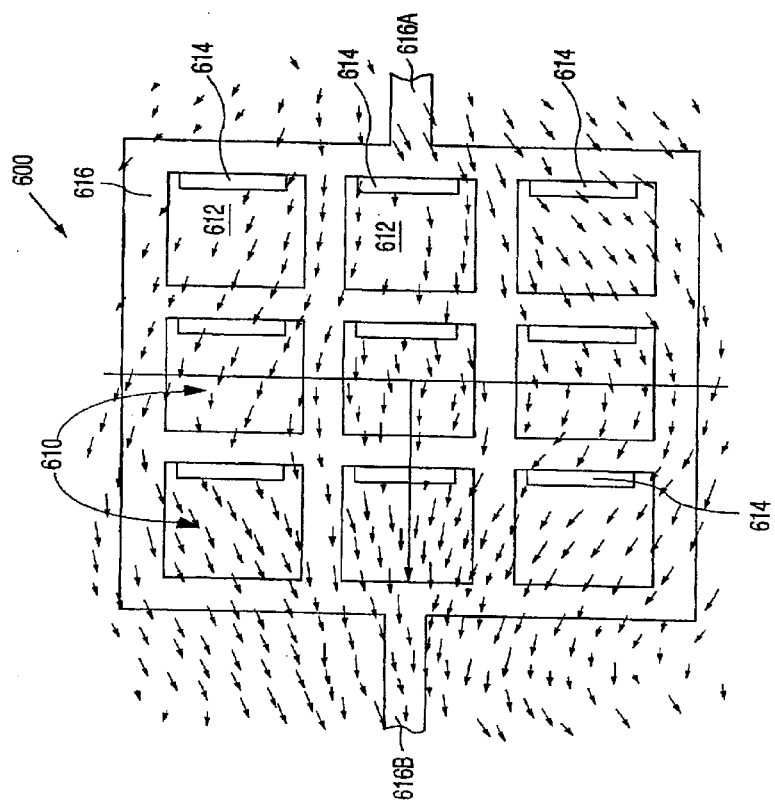

FIG. 6 shows a plan view that illustrates an example of an image array 600 in accordance with the present invention. As shown in FIG. 6, array 600 includes a number of active pixel sensor cells 610 which can range from a few cells to millions of cells. Each cell 610, in turn, includes a n+ photodiode region 612, a sense trace 614, and reset, source-follower, row select, and column select transistors in a manner similar to cell 500.

In accordance with the present invention, array 600 also includes a grid 616 that is formed over and insulated from the active pixel sensor cells 610. Grid 616 has an input stub 616A and an output stub 614B. (Grid 616 can include more than one input stub and more than one output stub.) As shown in FIG. 6, grid 616 is formed over the active pixel sensor cells in such a way as to expose n+ photodiode region 612 and sense trace 614, and cover the reset, source-follower, row select, and column select transistors.

In operation, a sawtooth current as described above is made to flow from input stub 616A to input stub 616B through grid 616. The sawtooth current sets up a pulsating electric field, with the arrows representing the electric field lines, that induces electrons collected by n+ photodiode region 612 to accumulate in the region below sense trace 614. The electrons that accumulate beneath sense trace 614 increase the dynamic range of cells 610.

It should be understood that the above descriptions are examples of the present invention, and various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method of inducing charge carriers to move through a semiconductor material to a collection region in the semiconductor material, a conductive trace being formed over and insulated from the semiconductor material, the method comprising the step of making a sawtooth current flow through the conductive trace, the sawtooth current inducing charge carriers to move through the semiconductor material to the collection region.

2. The method of claim 1 wherein the sawtooth current has a plurality of periods, each period has a first edge and a second edge, the second edge having a steeper slope than the first edge, and inducing charge carriers to move through the semiconductor material, the first edge causing substantially no charge carriers to move through the semiconductor material.

3. The method of claim 1 wherein a layer of insulation material is formed over the collection region, and a contact is formed on the collection region through the layer of insulation material.

4. The method of claim 3 wherein the contact is electrically connected to a gate of a transistor.

5. The method of claim 1 wherein the semiconductor material has a first conductivity type, and is formed in a photodiode material of a second conductivity type.

6. The method of claim 5 and further comprising the steps of:
   placing a first potential on the semiconductor material with respect to a second potential on the photodiode material;
   collecting light energy for a predetermined period of time after the first potential has been placed on the semiconductor material; and
   detecting a change in the first potential at the end of the predetermined period.

7. The method of claim 5 and further comprising a reset transistor, the reset transistor having:
   a source/drain region of the first conductivity type formed in the photodiode material; and
   a channel region formed between the source/drain region and the photodiode material.

8. The method of claim 7 and further comprising:
   a source-follower transistor having a gate electrically connected to the semiconductor material, and a source;
   a row select transistor having a drain connected to the source of the source-follower transistor, and a source; and
   a column select transistor having a drain connected to the source of the row select transistor.

9. The method of claim 5 and further comprising:
   a plurality of semiconductor material regions formed in the photodiode material, the semiconductor material being one of the semiconductor material regions, and
   a grid formed over and insulated from the photodiode material, the grid having a plurality of openings that are substantially in register with the plurality of semiconductor material regions, the conductive trace being a portion of the grid.

10. The method of claim 9 and further comprising a plurality of reset transistors formed adjacent to the plurality of semiconductor material regions, each reset transistor having:
    a source/drain region of the first conductivity type formed in the photodiode material; and
    a channel region formed between the source/drain region and the photodiode material.

11. The method of claim 10 and further comprising, with each reset transistor:
    a source-follower transistor having a gate electrically connected to the semiconductor material, and a source;
    a row select transistor having a drain connected to the source of the source-follower transistor, and a source; and
    a column select transistor having a drain connected to the source of the row select transistor.

* * * * *

UNITED STATES PATENT AND TRADEMARK OFFICE
CERTIFICATE OF CORRECTION

PATENT NO.    : 6,660,537 B1
DATED         : December 9, 2003
INVENTOR(S)   : Hopper et al.

It is certified that error appears in the above-identified patent and that said Letters Patent is hereby corrected as shown below:

<u>Drawings,</u>
Please delete drawing sheets Figures 1-6 and insert replacement sheets Figures 1-6 as attached herein.

Signed and Sealed this

Seventeenth Day of February, 2004

JON W. DUDAS
*Acting Director of the United States Patent and Trademark Office*